(12) United States Patent
Inoguchi et al.

(10) Patent No.: US 9,699,915 B2
(45) Date of Patent: Jul. 4, 2017

(54) METHOD OF MANUFACTURE AN ELECTRIC CIRCUIT

(71) Applicant: Semiconductor Components Industries, LLC, Phoenix, AZ (US)

(72) Inventors: Hiroshi Inoguchi, Tatebayashi (JP); Takayuki Taguchi, Hanyu (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 226 days.

(21) Appl. No.: 14/511,157

(22) Filed: Oct. 9, 2014

(65) Prior Publication Data

US 2016/0105964 A1   Apr. 14, 2016

(51) Int. Cl.
*H05K 3/22* (2006.01)
*H05K 3/00* (2006.01)
*H05K 3/20* (2006.01)
*H05K 3/34* (2006.01)

(52) U.S. Cl.
CPC .......... *H05K 3/222* (2013.01); *H05K 3/0014* (2013.01); *H05K 3/202* (2013.01); *H05K 3/3431* (2013.01); *H05K 2201/09118* (2013.01); *H05K 2201/09381* (2013.01); *H05K 2201/10015* (2013.01); *H05K 2203/049* (2013.01); *H05K 2203/0445* (2013.01); *Y02P 70/611* (2015.11)

(58) Field of Classification Search
CPC .......... H01R 9/00; H01R 9/03; H01R 13/648; H01R 13/6464; H05K 3/0014; H05K 3/202; H05K 3/222; H05K 3/3431; H05K 2201/09118; H05K 2201/09381; H05K 2201/10015; H05K 2203/0445; H05K 2203/049; Y10P 70/611

See application file for complete search history.

(56) References Cited

U.S. PATENT DOCUMENTS 6,171,149 B1 * 1/2001 van Zanten ........ H01R 23/6873
439/607.07
6,530,790 B1 * 3/2003 McNamara .......... H01R 23/688
439/101

FOREIGN PATENT DOCUMENTS

JP          5-33542 U      4/1993
JP       2001-127099 A    11/2001

* cited by examiner

*Primary Examiner* — Carl Arbes
(74) *Attorney, Agent, or Firm* — Rennie William Dover

(57) ABSTRACT

In accordance with an embodiment, a method for manufacturing an electric circuit that includes providing a support having a first region, the first region having a first conductor that has a first sidewall and a second conductor that has a second sidewall, wherein the first conductor is electrically isolated from the second conductor is provided. A distance between the first sidewall and the second sidewall is increased using a technique such as stamping, etching, or trimming. A first circuit element is coupled to the first conductor and encapsulated in a mold compound. In accordance with another embodiment, an electric circuit includes a support having interconnect with sidewalls wherein notches extend from one or more of the sidewalls into the interconnect. A circuit element is coupled to the interconnect by a bonding agent and protected by a protective structure.

9 Claims, 2 Drawing Sheets

-PRIOR ART-

METHOD OF MANUFACTURE AN ELECTRIC CIRCUIT

BACKGROUND

The present invention relates, in general, to electric circuits and, more particularly, to electric circuit support structures.

Semiconductor devices are typically manufactured from a semiconductor wafer. The wafer is diced to form chips or dice, which are mounted to a substrate such as a leadframe. Similarly, passive devices such as capacitors and resistors may be mounted to the leadframe. The devices are typically bonded to the leadframes using solder. FIG. 1 illustrates a device 116 bonded to portions 112 and 114 of a leadframe using solder 118. A drawback with this structure is that the solder may form bridges that short the terminals of the devices mounted to the leadframe, which results in failure of the electronic module.

Accordingly, it would be advantageous to have an electric circuit and a method for manufacturing the electric circuit that mitigates formation of bridges. It would be of further advantage for the electric circuit to be cost efficient to manufacture.

BRIEF DESCRIPTION OF THE DRAWINGS

The present invention will be better understood from a reading of the following detailed description, taken in conjunction with the accompanying drawing figures, in which like reference characters designate like elements and in which.

Figure 1:
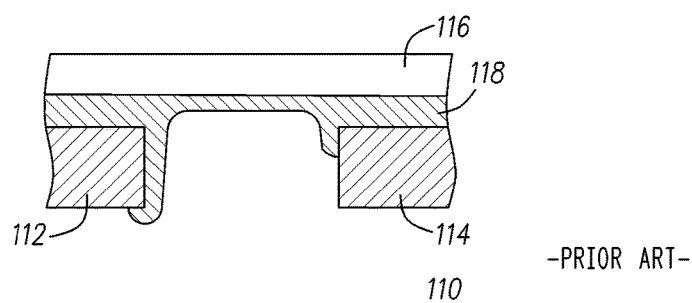
FIG. 1 is cross-sectional view of a portion of a prior art electric circuit.

For simplicity and clarity of illustration, elements in the figures are not necessarily to scale, and the same reference characters in different figures denote the same elements. Additionally, descriptions and details of well-known steps and elements are omitted for simplicity of the description. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action and the initial action. The use of the words approximately, about, or substantially means that a value of an element has a parameter that is expected to be very close to a stated value or position. However, as is well known in the art there are always minor variances that prevent the values or positions from being exactly as stated. It is well established in the art that variances of up to about ten percent (10%) (and up to twenty percent (20%) for semiconductor doping concentrations) are regarded as reasonable variances from the ideal goal of exactly as described.

DETAILED DESCRIPTION

Generally, the present invention provides a method and structure for inhibiting shorting or bridging in an electric circuit that could decrease device reliability and lead to device failure. An electric circuit may include an active device or a passive device coupled to a substrate or a support using a bonding agent. The active device and the passive device may be manufactured from a semiconductor chip. It should be noted active devices and passive devices may be referred to as circuit elements. For example, a chip capacitor may be a circuit element, and a chip resistor may be a circuit element. Alternatively, the circuit elements may be capacitors, resistors, and inductors. In accordance with an embodiment, the substrate is a leadframe and the bonding agent is solder. By way of example, the solder is derived from a silver paste.

In accordance with an embodiment, method for manufacturing an electric circuit comprises providing a support having a first region that includes a first conductor that having a first sidewall and a second conductor having a second sidewall, wherein the first conductor is electrically isolated from the second conductor. A distance between the first sidewall of the first conductor and the second sidewall of the second conductor is increased. A circuit element is coupled to the first conductor and encapsulated in a mold compound.

In accordance with another embodiment, distance between the first sidewall of the first conductor and the second sidewall of the second conductor is increased by forming a first notch that extends from the first sidewall into the first conductor.

In accordance with another embodiment, distance between the first sidewall of the first conductor and the second sidewall of the second conductor is increased by forming a first notch that extends from the first sidewall into the first conductor and forming another notch that extends from the second sidewall into the second conductor.

In accordance with another embodiment, the notch in the first sidewall has a semicircular shape, the notch in the second sidewall has a semicircular shape, or the notches in both the first sidewall and the second sidewall have semicircular shapes.

In accordance with another embodiment, the circuit element is a chip capacitor.

In accordance with an embodiment, method for manufacturing an electric circuit includes providing a substrate having a first circuit element receiving area, a first interconnect, and a second interconnect, wherein the first interconnect is spaced apart from the second interconnect, and wherein the first interconnect has a first surface and the second interconnect has a second surface. A first dimple is formed in the first interconnect, wherein the first dimple extends from the first surface into the first interconnect. A first circuit element is connected to the first interconnect with a bonding agent, wherein a portion of the bonding agent settles in the first dimple.

In accordance with another embodiment, the substrate has a second circuit element receiving area, wherein a second circuit element is coupled to the second circuit element receiving area.

In accordance with another embodiment, a second dimple is formed in the second interconnect, wherein the second dimple extends from the second surface of the second interconnect into the second interconnect.

In accordance with another embodiment, an electric circuit comprises a support having a first circuit element receiving area, a first interconnect having a first surface, a second interconnect having a second surface, and a first notch. The first interconnect is spaced apart from the second interconnect such that the first surface faces the second surface. The first notch extends from the first surface into the first interconnect. A first circuit element is coupled to the first interconnect by a bonding agent, wherein a portion of the bonding agent extends into the first notch. A protective structure encapsulates at least a portion of the first interconnect, at least a portion of the second interconnect, and the first circuit element.

In accordance with another embodiment, the support is one of a leadframe or a printed circuit board.

Figure 2:
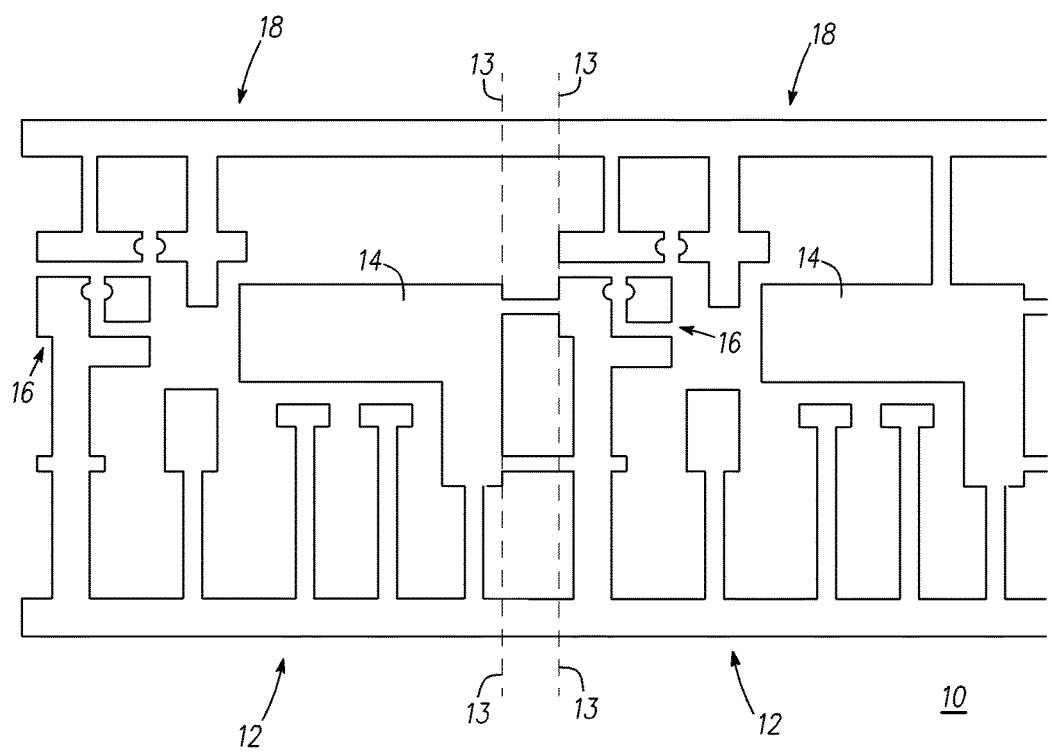
FIG. 2 is a top view of an electric circuit at a beginning stage of manufacture in accordance with an embodiment of the present invention.

FIG. 2 is a top view of a portion of an electrically conductive support strip 10 having a top surface, a bottom surface, and a thickness, T. Support structure 10 comprises one or more support structures 12. Each support structure 12 includes device receiving areas configured to receive one or more active devices, one or more passive devices, or one or more active devices and one or more passive devices. In addition, each support structure includes a plurality of leads. Suitable materials for support structure 12 include a metal such as, for example, copper or aluminum, a printed circuit board material, a direct bonded copper substrate, or the like. Typically, after devices have been mounted to support strip 10, it is singulated into individual components, wherein each individual component includes a support structure 12. Broken lines 13 indicate the area in which support strip 10 is separated into the individual support structures 12. In accordance with an embodiment, conductive support strip 10 is a copper strip that may be referred to as a leadframe strip, wherein support structures 12 may be referred to as leadframes, the leads may be referred to as leadframe leads, and some of the device receiving areas may be referred to as flags or paddles. By way of example, leadframe 12 has a device receiving area 14, a device receiving area 16, a device receiving area 18, and leadframe leads 20, 22, 24, 26, and 28.

Figure 3:
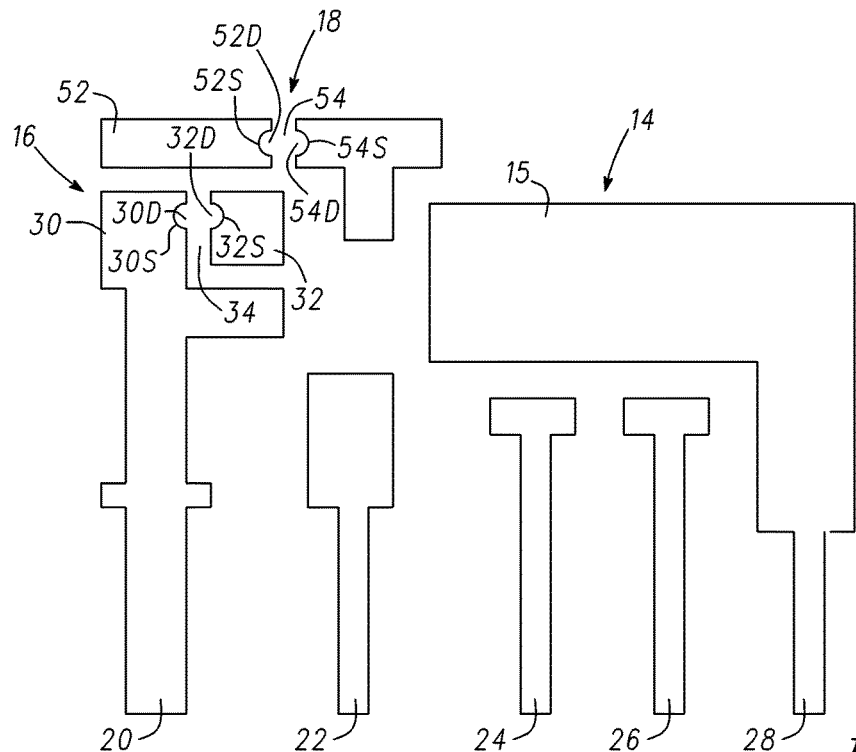
FIG. 3 a top view of the electric circuit of FIG. 2 at a later stage of manufacture.
Figure 4:
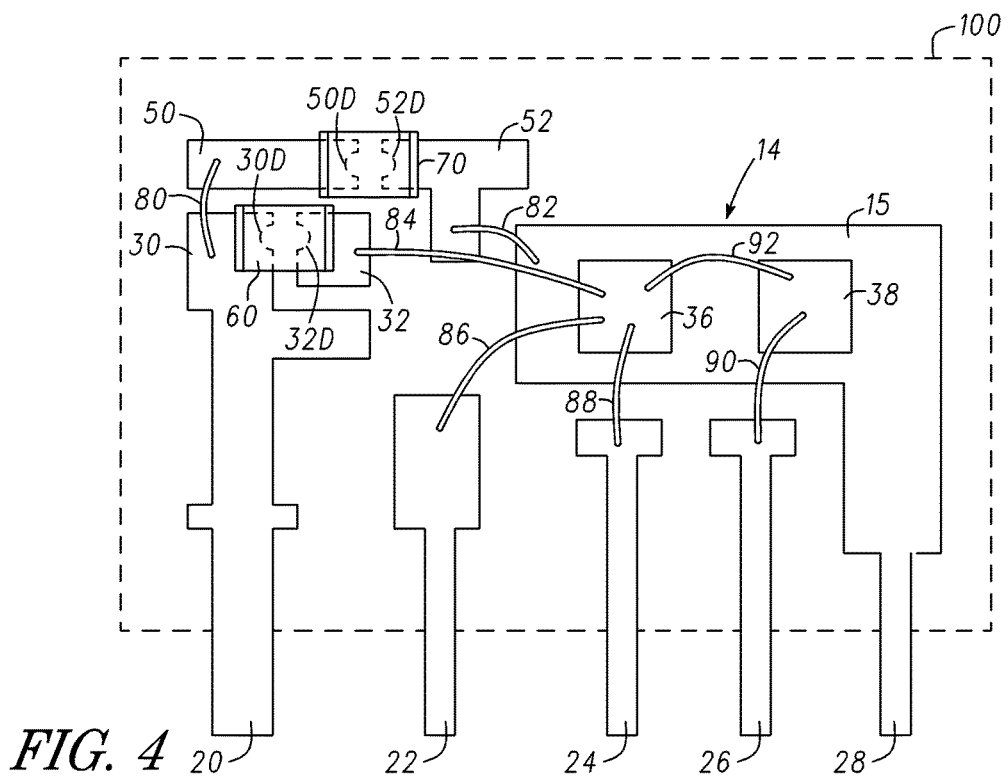
FIG. 4 a top view of the electric circuit of FIG. 3 at a later stage of manufacture.

Referring now to FIG. 3, device receiving area 14 may be configured to receive an active device such as for example one or more semiconductor chips that may include integrated circuits, whereas device receiving areas 16 and 18 may be configured to receive passive circuit elements such as for example inductors, resistors, and capacitors. It should be noted that a semiconductor chip comprising an active device may be flip chip mounted to device receiving area 16 device receiving area 18, or both. By way of example, device receiving area 14 comprises copper.

Device receiving area 16 includes a conductor 30 having a sidewall 30S and a conductor 32 having a sidewall 32S. Conductors 30 and 32 are electrically isolated from each other by a gap 34, wherein sidewall 30S faces sidewall 32S such that gap 34 is between sidewalls 30S and 32S. Conductors 30 and 32 may be referred to as interconnects, frame regions, etc. and may be comprised of copper. Sidewalls 30S may have a dimple 30D that extends from sidewall 30S into frame region 30, or sidewall 32S may have a dimple 32D that extends from sidewall 32S into frame region 32, or sidewalls 30S and 32S may each have dimples 30D and 32D that extend into frame regions 30 and 32, respectively. Dimples 30S and 32S may be referred to as notches, recesses, cavities, hollows, indentations, bridge mitigation features or the like. Dimples 30S and 32S may be formed using a stamping technique or stamping process, an etching technique or an etching process, a laser trimming technique or a laser trimming process, a sawing technique or a sawing process, a punching technique or a punching process, or the like. It should be noted that in some embodiments, dimples 30S and 32S extend the entire thickness of conductors 30 and 32, and in other embodiments dimples 30S and 32S extend partially into conductors 30 and 32.

Device receiving area 18 includes a conductor 50 having a sidewall 50S and a conductor 52 having a sidewall 52S. Conductors 50 and 52 are electrically isolated from each other by a gap 54 and may be comprised of copper, wherein sidewall 50S faces sidewall 52S such that gap 54 is between sidewalls 50S and 52S. Sidewalls 50S may have a dimple 50D that extends from sidewall 50S into conductor 50, or sidewall 52S may have a dimple 52D that extends from sidewall 52S into conductor 52, or sidewalls 50S and 52S may each have dimples 50D and 52D that extend into conductors 50 and 52, respectively. Dimples 50D and 52S may be referred to as notches, recesses, cavities, hollows, indentations, bridge mitigation features, or the like. Conductors 50 and 52 may be referred to as interconnects, frame regions, etc. and may be comprised of copper.

Referring now to FIG. 3, semiconductor chips 36 and 38 are bonded to device receiving area 14 using for example, solder. Similarly, a passive circuit element such as, for example, a chip capacitor 60 is bonded to device receiving area 16. Chip capacitor 60 has a terminal bonded to conductor 30 and a terminal bonded to conductor 32 using solder. Dimples 30D and 32D provide channels or regions through which solder can flow thereby precluding solder bridges from forming between frame regions 30 and 32 which in turn improves the reliability electrical component formed using leadframe 12.

A passive circuit element such as, for example, a chip capacitor 70 is bonded to device receiving area 18. Chip capacitor 70 has a terminal bonded to conductor 50 and a terminal bonded to conductor 52 using solder. Dimples 50D and 52D provide channels or regions through which solder can flow thereby precluding solder bridges from forming between conductors 50 and 52 which in turn improves the reliability electrical component formed using leadframe 12.

Leadframe lead 20 may be electrically connected to a terminal of chip capacitor 70 through a bond wire 80, wherein the other terminal of chip capacitor 70 may be connected to flag 15 through a bond wire 82. Chip capacitor 60 has a terminal soldered to leadframe lead 20 and a terminal soldered to conductor 30, wherein conductor 30 is electrically connected to semiconductor chip 36 through a bond wire 84. Leadframe lead 22 is electrically connected to semiconductor chip 38 through a bond wire 86; leadframe lead 24 is electrically connected to semiconductor chip 36 through a bond wire 88; and leadframe lead 26 is electrically connected to semiconductor chip 38 through a bond wire 90. Leadframe lead 28 is electrically connected to device receiving area 14. Semiconductor chip 36 may be electrically connected to semiconductor chip 38 through a bond wire 92.

Still referring to FIG. 3, semiconductor chips 36 and 38, chip capacitors 60 and 70, portions of leadframe leads 20-28, and bond wires 82-90 may be encapsulated in a mold compound identified by broken line 100. Thus, dimples 30D, 32D, 50D, and 52D are encapsulated within mold compound 100.

By now it should be appreciated that a circuit element and a method for manufacturing the circuit element have been provided. In accordance with embodiments, notches are included that preclude the formation of bridges in the circuit element that may decrease reliability and cause device failures caused by shorting.

Although specific embodiments have been disclosed herein, it is not intended that the invention be limited to the disclosed embodiments. Those skilled in the art will recognize that modifications and variations can be made without departing from the spirit of the invention. It is intended that the invention encompass all such modifications and variations as fall within the scope of the appended claims.

What is claimed is:

1. A method for manufacturing an electric circuit, comprising:
   providing a support having a first region, the first region having a first conductor that has a first sidewall and a second conductor that has a second sidewall, wherein the first conductor is electrically isolated from the second conductor;
   increasing a distance between the first sidewall of the first conductor and the second sidewall of the second conductor to form solder flow channels that are configured to preclude formation of solder bridges;
   coupling a first circuit element to the first conductor; and
   encapsulating the first circuit element and a portion of the first conductor having the first sidewall in a mold compound.

2. The method of claim 1, wherein increasing the distance between the first sidewall of the first conductor and the second sidewall of the second conductor includes forming a first notch that extends from the first sidewall into the first conductor.

3. The method of claim 2, wherein increasing the distance between the first sidewall of the first conductor and the second sidewall of the second conductor includes forming a second notch that extends from the second sidewall into the second conductor.

4. The method of claim 3, wherein forming the first notch and forming the second notch includes forming the first notch and the second notch by a stamping process.

5. The method of claim 3, wherein forming the first notch and forming the second notch includes forming the first notch and the second notch by an etching process.

6. The method of claim 4, wherein forming the first notch and forming the second notch includes forming the first notch having a semicircular shape and forming the second notch having a semicircular shape.

7. The method of claim 1, wherein coupling a first circuit element to the first conductor includes soldering the first circuit element to the first conductor.

8. The method of claim 1, wherein coupling the first circuit element to the first conductor includes:
   providing the first circuit element with a first terminal and a second terminal; and
   coupling the first terminal to the first conductor and the second terminal to the second conductor.

9. The method of claim 8, wherein coupling the first circuit element to the first conductor includes coupling a chip capacitor to the first conductor and to the second conductor.

* * * * *